United States Patent [19]
Ball

[11] Patent Number: 6,030,588
[45] Date of Patent: Feb. 29, 2000

[54] ZONE REFINER APPARATUS AND METHOD FOR PURIFYING ORGANIC SUBSTANCES

[76] Inventor: Dean M. Ball, 4282 Pillsbury Rd., Gainesville, Ga. 30507

[21] Appl. No.: 09/031,746

[22] Filed: Feb. 27, 1998

[51] Int. Cl.$^7$ ........................................... B01D 9/04
[52] U.S. Cl. .................................. 422/250.1; 422/245.1; 568/324; 585/834
[58] Field of Search ................ 568/324; 585/834; 422/245.1, 250.1; 23/295 R

[56] References Cited

U.S. PATENT DOCUMENTS

| | | | |
|---|---|---|---|
| 3,844,724 | 10/1974 | Sloan | 23/273 SP |
| 4,196,042 | 4/1980 | Rennolds | 156/616 R |
| 4,255,390 | 3/1981 | Rennolds | 422/250 |
| 4,423,248 | 12/1983 | Rennolds | 568/324 |
| 4,888,051 | 12/1989 | Bollong et al. | 75/10.11 |

OTHER PUBLICATIONS

Pfann, W.G., Zone Melting, 2nd Edition, John Wiley & Sons, New York, 1966, pp. 29–31, 71–103, 158–167, 269–271.

*Primary Examiner*—Robert Kunemund
*Assistant Examiner*—Matthew Anderson
*Attorney, Agent, or Firm*—Kennedy, Davis & Hodge LLP

[57] ABSTRACT

A high speed zone refiner (10) includes a plurality of elongated heating elements (23) mounted side by side to provide a plurality of spaced elongated heating zones and a sample tray (44) for holding an impure organic specimen. The zone refiner also includes a motor (36) and cam (38) arrangement for cyclically moving the sample tray generally horizontally over the heat bed. The heat bed includes cool zones interspersed between the hot zones with the cool zones comprising a plurality of elongated cooling channels (14) also mounted in a side by side arrangement but alternating with the heating elements. The sample tray is sealed and having a bottom (58) of flexible metallic foil. Using the refiner, hot and cold zones are moved laterally within the impure organic specimen causing impurities to migrate to one end of the sample tray.

4 Claims, 5 Drawing Sheets

ZONE REFINER APPARATUS AND METHOD FOR PURIFYING ORGANIC SUBSTANCES

TECHNICAL FIELD

The present invention relates to apparatuses and methods for purifying organic substances.

BACKGROUND OF THE INVENTION

In the manufacture of certain electronic components such as integrated circuits and transistors, extraordinarily pure specimens of silicon of germanium are required. The electronic industry uses the technique known as zone refining to separate these pure specimens. In 1952 William G. Pfann of the Metallurgical Research Department of Bell Telephone Laboratories developed this process for the purification of materials used in the semiconductor industry. Pfann found that by passing a molten zone along a rod of silicon or germanium, that is a varying segment of the rod that is heated to a liquid state, he could cause the impurities to move in the direction of the molten zone. The impurities were reduced in the solid parts of the rod to a few parts per billion, by repeating this process many times. Pfann found that the impurities were concentrated at the end of the rod. This process is now widely used in the semiconductor industry as a purification technique.

After the initial development by Pfann, chemical researchers used the principles of zone refining for the purification of organic chemicals, with some success. When an organic liquid is cooled crystals are formed. The researchers found that when a homogeneous organic liquid mixture is cooled, the composition of the solid that crystallizes in the mixture has a lower concentration of impurities than that of the surrounding liquid. The purification of a substance by zone refining depends on this concentration differential between phases, since the liquid retains much of the impurities.

Early colonial Americans made use of a primitive form of zone refining when they left jugs of fermented apple juice or hard cider outside on cold nights. The water in the jugs would freeze out of the mixture, leaving only the alcohol and other impurities in liquid phase. These impurities could then be poured off the ice the next morning. Repeating this process for several nights increased the concentration of alcohol to high levels.

The current chemical laboratory method for zone refining organic materials is to pass a molten zone, that is a zone of heat sufficient to melt organic crystals into liquid phase, across a chemical sample contained in a vertically oriented glass tube. In this fashion a varying portion of the glass tube is heated throughout a radial segment. The diameter of the glass tubes used in this process is usually between 5 mm and 20 mm and the length is typically between 15 cm and 50 cm. The most common means of heating the tube is by passing an electric current through a resistance wire loosely wrapped about the tube. The wire is attached to a mechanism which moves it along the length of the tube at a rate of between 0.1 cm and 20 cm per hour. The passage of the resistance wire along the length of the tube creates a moving heated zone relative to the tube.

Experimental problems have been associated with purifying organic chemicals by the vertical glass tube method however. These problems are caused by the relatively low thermal conductivity of organic compounds and by the coefficient of thermal expansion of organic materials being many times higher than that of glass. If a careless operator applies too much heat to a sample, the sample expands and bursts the glass tube. The glass tubes also limit the rate that the heated zone can be moved, since the heat transfer rate into the middle of the tube is slow. Another limitation of this method is in the quantity of sample that can be refined at any given time. If the tube diameter or length is lengthened to increase capacity, the time required to pass a heated zone from one end to the other is increased proportionately.

The zone refining methods used in current chemical laboratories therefore require a great deal of attention to experimental technique. The purification obtained often requires days to achieve. These limitations have prevented an otherwise promising experimental technique from becoming a widely practiced laboratory procedure.

Zone refining resembles distillation and gas and liquid chromatography in that it depends upon the distribution of material between two phases. The theory developed for fractional distillation and gas and liquid chromatography can be applied directly to zone refining with some modifications. Both theories predict that the highest purity and best separation is achieved when a large number of separation stages i.e., plates in distillation, and theoretical plates in chromatography, are involved. These theories also predict that the speed of the separation can be significantly increased if the dimensions of the separating apparatus are made sufficiently small. When objects are small, the rates of heat and mass transfer in and out of the object is much faster than with large objects. It would therefore be expected that the highest efficiency in zone refining would be obtained if the tubing were made very small and the number of zones increased so that the sample is subjected to several zones at one time. Obviously however, extremely small tubes can contain only extremely small amounts of sample i.e a few milligrams. These small tubes would not be very useful to the chemist who requires a relatively large chemical sample for testing at a later date.

Given the practical limitations on conventional zone refining laboratory procedures, rapid high volume zone refiners have not been readily available. Accordingly, a need remains for a high speed zone refiner which allows for the purification of a relatively large sample of organic substance over a relatively short time period. Furthermore, a need remains for a commercially viable zone refiner which is not susceptible to the problems of traditional vertical glass tube refiners. Accordingly, it is to the provision of such that the present invention is primarily directed.

SUMMARY OF THE INVENTION

In a preferred form of the invention an impure organic substance is refined by spreading the substance over a generally level support surface, and heating the substance to form a series of alternating hot and cold elongated zones in it. The hot and cold zones are moved laterally within the substance so that the impurities migrate to one end of the support surface. The method is preferably practiced with a refiner having a heat bed having a plurality of elongated heating elements mounted side by side to provide a plurality of side by side spaced elongated heating zones. The refiner also has a sample tray for holding the specimen and means for cyclically moving the tray generally horizontally over said heat bed. In this manner organic substances can be refined in sizable quantities over relatively short periods of time without the problems associated with traditional column zone refiners.

DETAILED DESCRIPTION

Figure 1:
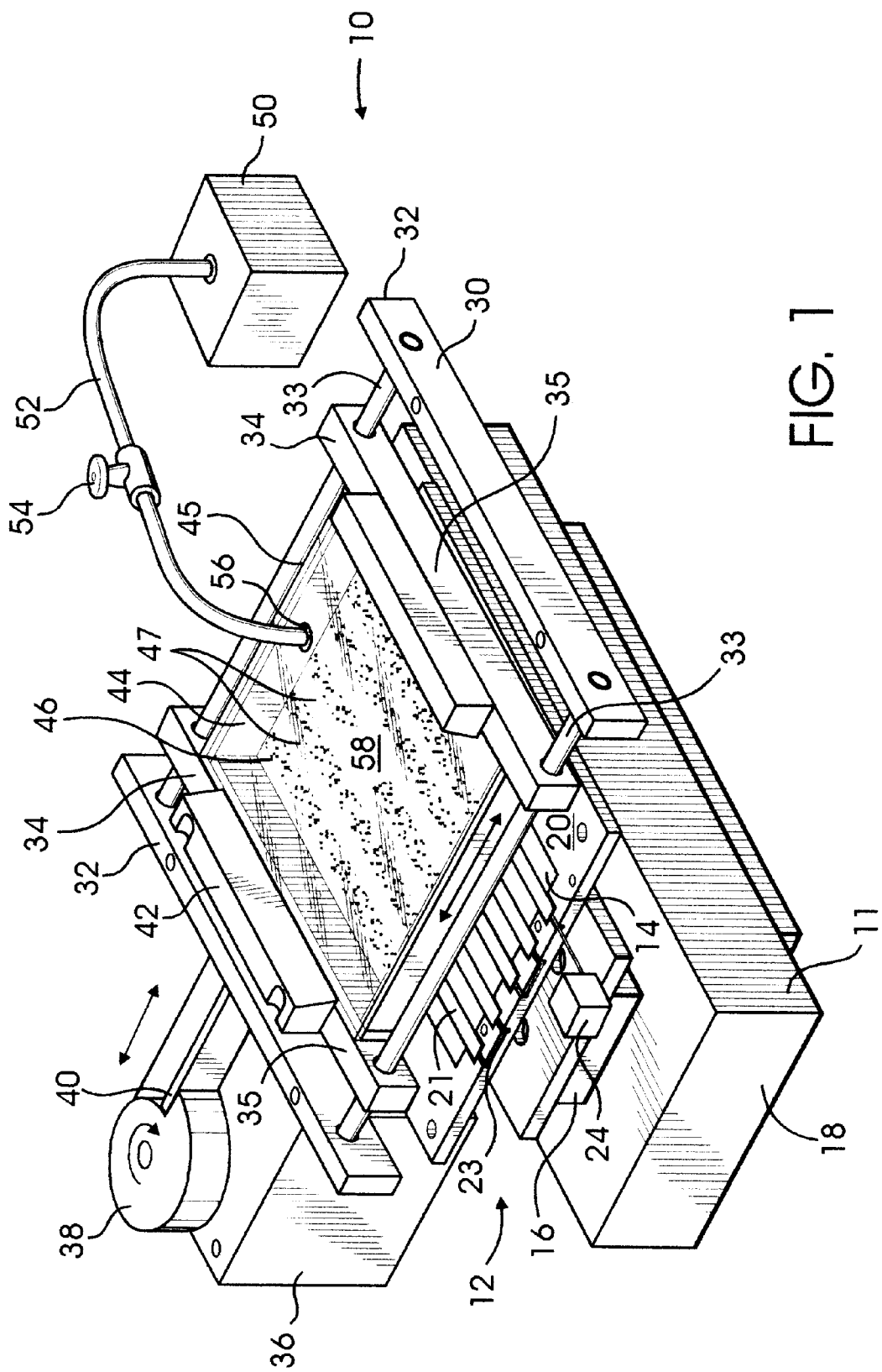
FIG. 1 is a perspective view of a zone refiner that embodies principles of the invention in its preferred form.
Figure 2:
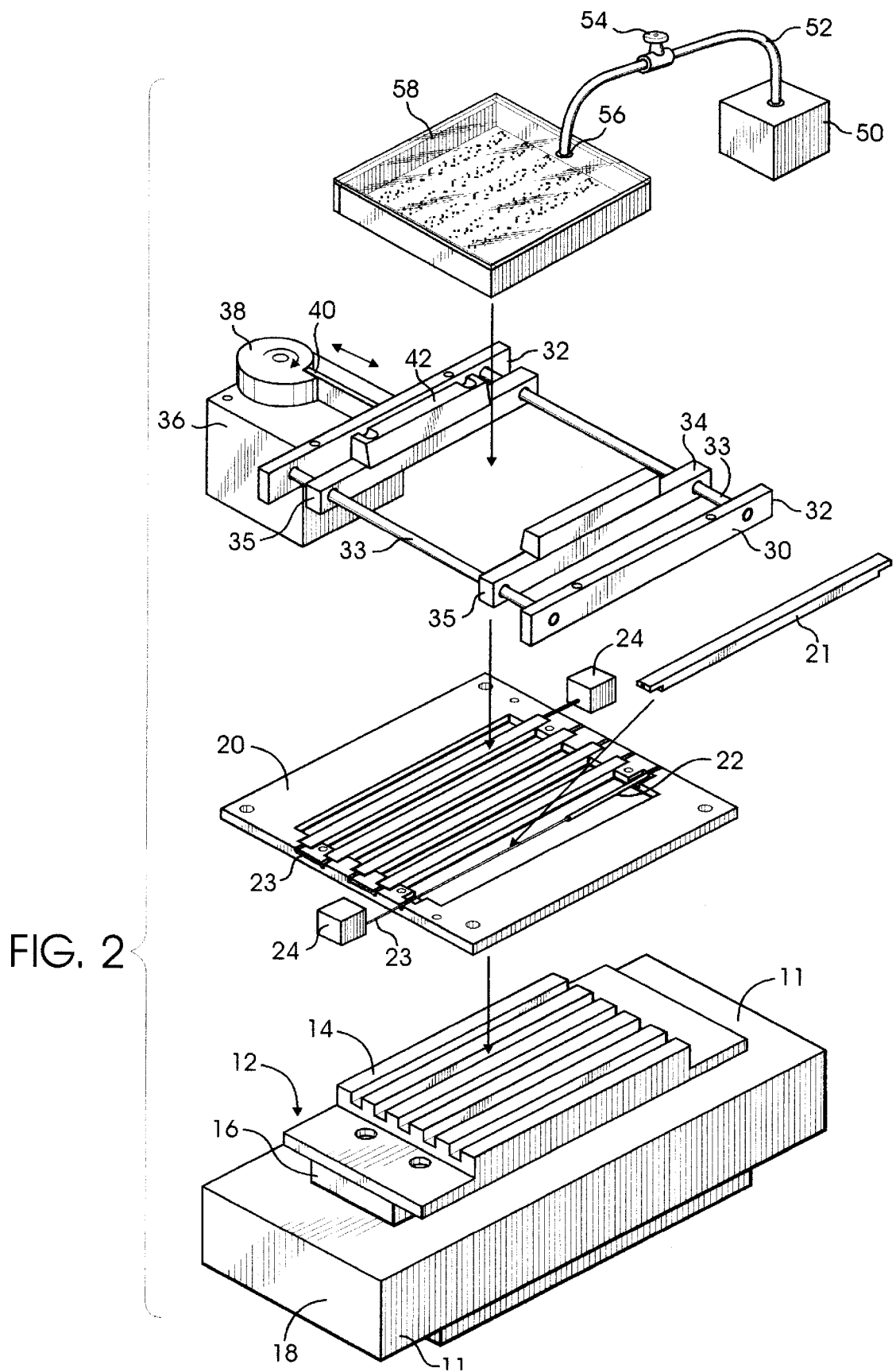
FIG. 2 is an exploded view, in perspective, of the zone refiner of FIG. 1.
Figure 3:
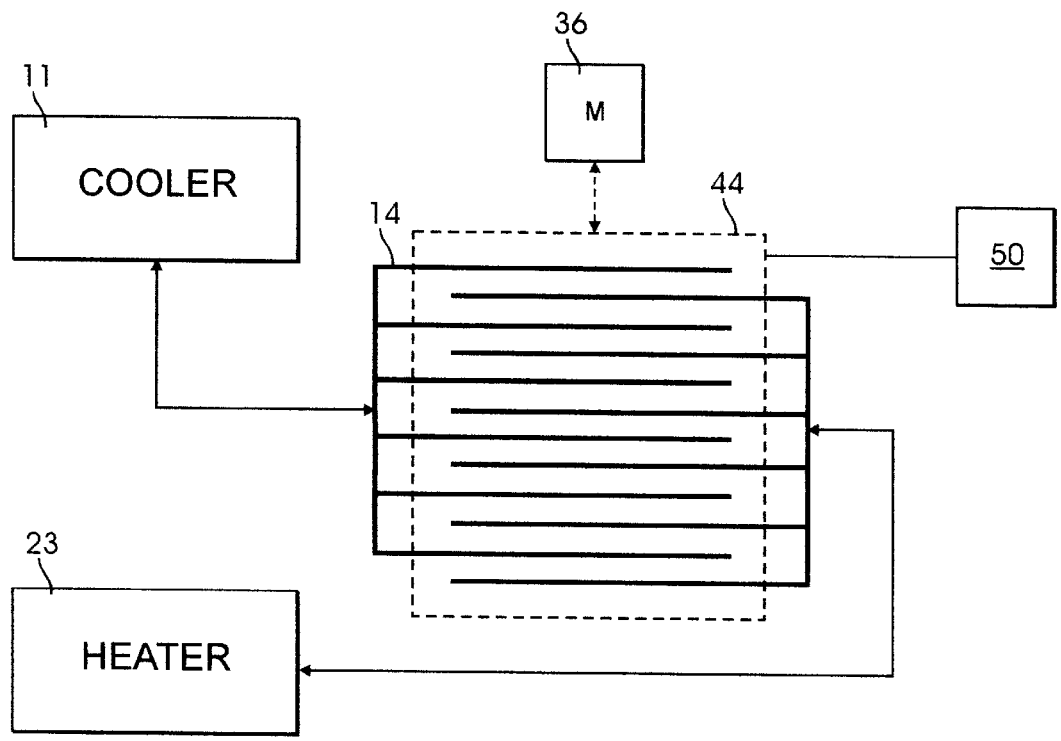
FIG. 3 is a schematic block diagram of the zone refiner of FIG. 1.

Referring now to the drawings, a high speed zone refiner 10 is shown in FIGS. 1–3 for purifying organic substances. It has a cooling block or module 11 having a top portion 12. The top portion 12 has a series of six parallel and protruding cooling channels 14 separated by five recesses. The cooling block is preferably a Peltier effect type cooler module having a cold side 16 and a hot side 18. The Peltier effect cooling module here is a 150 watt thermoelectric solid state cooler with a platinum RTD temperature sensor with proportional control. The cooling module is connected to a 24 volt D.C. power source (not shown). The cooling module has a 3½ digital display of set and actual temperatures (not shown), and is controlled to within +/−1° C. from −10° C. to +80° C. Approximately 75% to 80% of all organic chemicals are crystalline solids at a temperature of −10° C.

A heater module 20 is positioned on top of the cooler module 11. The heater module 20 is a frame which defines an opening for receiving the cooling channels 14. The heater module 20 is received over the six cooling channels 14 so that the cooling channels are held within the heater module frame. Five aluminum casings, (the nichrome wire housings) 21 each, having a channel (not shown) through their longitudinal axis, sit between the cooling channels 14. A ceramic cylinder 22 passes through each of the nichrome wire housings 21. The ceramic cylinders are alumina (aluminum oxide). A single nichrome heater wire 23 is threaded down the center of each of the ceramic cylinders in the respective housings 21 forming an array of elements. Thus the term elements herein is not meant to say that they are electrically unconnected. The ceramic cylinders 22 are used to prevent the aluminum casings 21 from contacting the nichrome wire 23. Furthermore, the ceramic cylinders 22 allow for much of the heat from the nichrome heater wire to transfer directly into the aluminum casings 21 for an even heating effect. The heater preferably comprises a 150 watt resistance wire which passes through the five aluminum blocks and includes a platinum RTD temperature sensor with proportional control (not shown). The heater is electrically connected to a 24 volt D.C. power source (not shown). The heater also preferably includes a 3½ Digit Display of set and actual temperatures and is controlled to within +/−1° C. from 0° .C to 200° C.

With the cooling module supported in a level orientation, the cooling channels 14 and five nichrome wire housings 21 are all positioned juxtaposed in the heater module frame 20, the cooling channels and nichrome wire housings forming a continuous level surface, or heat bed, but of alternating heating and cooling surfaces or zones, as seen in FIG. 1. The term heat bed is referring to a bed with a thermal differential where relatively cooler zones are interspersed with relatively hotter zones, rather than as to any relationship necessarily connected to room temperature. Thus in some cases, where substances may be liquid at room temperature, a cool zone can be a zone with a temperature less than room temperature, with a zone at room temperature being a hot zone. It is important that a distinct definition of the heating and cooling zones be maintained in order for the zone refiner to work efficiently. The heat bed is generally level so as to maintain the phase transition definition between the respective zones, allowing for the migration of impurities.

A tray traverse mechanism 30 is mounted to the heater and cooler modules 11 and 20. The tray traverse mechanism has side supports 32 that support two parallel rods 33 which collectively provide a frame. A movable tray holder or carriage 34 is slidingly mounted on the rods 33. The carriage 34 includes two side supports 35.

The tray traverse mechanism also includes a motor 36 for cyclically moving the movable tray holder 34. Preferably the motor, which is electrically connected to a pulsing D.C. power source (not shown) is a step motor with high gear reduction that includes an Archimedes spiral cam 38 and cam follower 40. The cam follower 40 is attached to the carriage by a connection (not shown) which passes under the side support 32 closest to the motor. The stepper motor here has a 300 to 1 gear ratio. Optional springs may also be included to assist in return of the movable tray holder 34 to a starting position. This mechanism is illustrated schematically in FIG. 3.

The movable tray holder 34 also includes a tray locking or hold-down mechanism 42 having a pair of spring loaded latches that hold a sample tray 44 in place within the tray holder 34. A sample tray 44 is positioned within the movable tray holder 34 and beneath the tray locking mechanisms 42. The sample tray 44 may be of a borosilicate glass (Pyrex) or quartz construction, but preferably has walls fabricated from a thin metal (e.g. gold plated brass foil) approximately 0.002 inches thick at its base and one-sixteenth inches thick in its walls, with a transparent glass lid 45. Flexible gold plated brass foil is preferred for the tray bottom because of the inert nature of gold. A tray of thin metal sheeting is less fragile, and poses less risk of tray leakage, as the metal tray walls are either soldered or of unitary construction with the tray bottom. With a transparent lid 45, samples on alternating cold and hot zones, 46, 47 can be viewed through the transparent lid 45. The lid may also be of stainless steel construction with a transparent window insert. If the sample tray is of a glass construction, the sample tray has walls which are very thin, in the order of 0.3 to 0.7 mm. Borosilicate glass has a very low coefficient of linear expansion and will remain substantially flat when heated and cooled over alternate hot and cold zones.

An air pump 50 is connected to the tray lid 45 through a feeder tube 52 and a pressure regulator 54 through an opening in the top of the sample tray 44. A brass mounting 56 in the transparent lid 45 connects the air tube with the lid 45. Air pump 50, which is electrically connected to a municipal power source, (connection not shown) forces either air or inert gas through feeder tube 52 into a sample tray 44. An inert gas such as helium or argon may be preferred over air if the organic sample to be refined has a propensity to be oxidized by air. The sample tray is either 10×10×2 cm for samples weighing 7 to 15 grams, 5×10×2 cm for samples weighing 3.5 to 8 grams, 2×10×2 cm for samples weighing 2 to 4 grams, or 1×10×2 cm for samples weighing 1 to 2 grams.

In operation a 1 to 10 gram sample of an organic chemical is placed in sample tray 44 so that a thin layer of sample covers the entire bottom surface 58 of the tray 44. The sample is placed on the tray to a thickness of 0.5 to 2 mm. The feeder tube 52 of the air pump is connected through the opening 56 to the tray lid 45 and the lid is placed on the tray.

The tray is then inserted into the movable tray holder between the tray locking mechanism 42. The sample tray need not be pressurized or in fact covered if it is of the glass construction. It should be noted that for the preferable thin metal foil trays, pressurization of the sample tray is preferable so as to improve the effectiveness of the operation, because the pressure forces the bottom of the tray against the nichrome wire housings 21 and the cooling channels 14. This greatly increases the rate of heat transfer into and out of the sample. The locking mechanisms or latches are then clamped down onto the tray to hold it in place within the movable tray holder 34.

The high speed zone refiner may now be turned on initiating cooling along the Peltier effect cooling module 11 and heating along the nichrome heater wire 23. The heater is attached to an electronic circuit, shown generally as 24 that controls the temperature of the block to within 0.1° C. by means of a conventional proportional control circuit. The melt temperature and freezing temperature are adjustable to allow the operator to observe when the sample is melted and crystallized in alternating bands in the sample tray as illustrated by the stippling in FIG. 1.

The tray traverse mechanism is then activated and the purification process begins. The tray traverse mechanism operates by moving the tray over hot and cold zones in a direction away from the motor 36, at a rate of from 0.1 to 50 centimeters per hour. Tray movement is relatively slow and is reversed after traveling about 2 centimeters, which is the width of one hot and one cold zone. The reverse movement is rapid, about 1 centimeter per second so that the sample zones are not disturbed. The cam 38 causes the carriage 34 to oscillate linearly two centimeters per each revolution of the cam (the distance encompassed by a hot and a cold zone) and reverse. Since the speed of the returning carriage during each revolution is much faster than the rate of movement of the hot and cold zones on the sample tray, the hot and cold zones, for all practical purposes, move smoothly along the sample tray from one end to the other. In this fashion the hot and cold zones progressively move across the sample tray so that the impurities in the organic sample eventually congregate at the side adjacent to the motor 36. The high speed zone refiner allows several linear hot and cold zones to move along the tray simultaneously. While the tray moves in the preferred embodiment, it should be understood that the heater and cooler modules could instead be made to move under the tray.

The stepper motor and spiral cam move the sample tray 44 along a linear path indicated by arrows on FIG. 1 on the parallel rods 33 of the tray traverse mechanism 30. The stepper motor control is continuously variable from 0.1 to 50.0 cm per hour, depending on the needs of the operator. As the sample tray 44 and the movable tray holder 24 move along their linear paths, the cold and hot zones created by the cooling channels 14 and nichrome heater wire 23 respectively crystallize and liquify the sample contained in the sample tray 44 directly above. Essentially, as the sample tray 44 moves across its linear path, linear strips of sample fluid above the corresponding cold and hot zones freeze and melt. During tray movement, the sample tray is held against the heating and cooling blocks by springs in the latching mechanism. The continuous application of pressurized air or inert gas from the air pump 50, is maintained between 0.05 to 0.5 pounds per square inch inside the tray, causing the sample on the tray bottom 58 to have very close contact with the hot and cold zones, thereby creating better thermal conduction. Movement of the hot and cold zones across the sample tray is essentially continuous. At a (typical) zone rate of 10 centimeters per hour with five zones operating, the sample is subjected to five melting and freezing transitions per hour. The operator returns between two to four hours (10 to 20 phase transitions) later and removes the sample tray. With this number of phase transitions, a typical sample of about 95%–98% purity will be purified to 99.99% or better. The zone refiner is then shut off so that the liquid sample can recrystallize. The sample can then be removed from various parts of the tray depending on the level of purity desired.

Figures 4A, 4B, 4C:
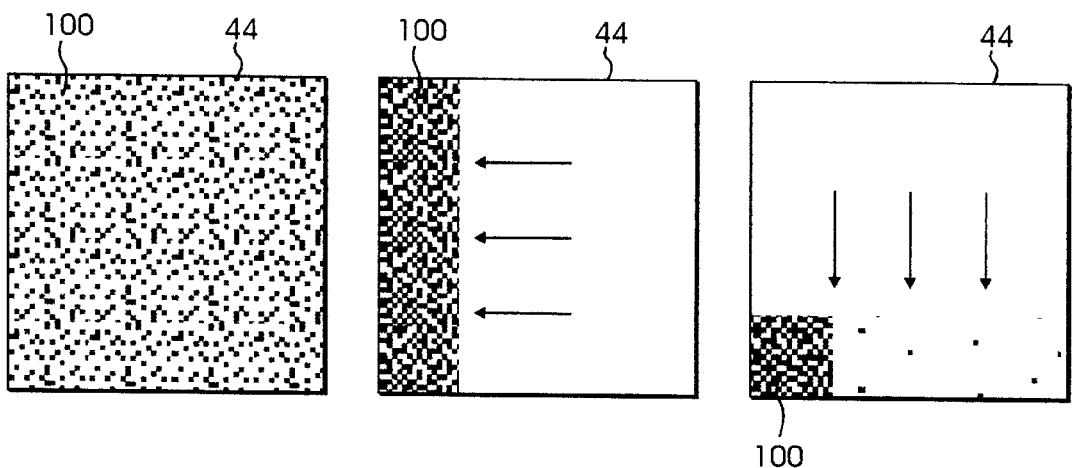
FIGS. 4A, 4B and 4C progressively illustrate the migration of impurities during operation of the zone refiner.

As illustrated in FIGS. 4A–4C, as the sample tray moves along its linear path the impurities 100 congregate on the side of the sample tray adjacent the motor 36. If the tray is then removed and rotated 90 degrees and replaced in the mechanism, a second run of the path isolates the impurities into one corner of the tray as illustrated in FIG. 4C. By isolating the impurities at one location, a researcher can evaluate the impurities of a sample or purify the sample to a high degree of purity.

The zone refiner with sample tray offers several advantages over the use of a conventional vertical tube for zone refining of organic substances. These advantages include the ability of the sample to be quite thin to expedite heat transfer while at the same time allowing a much larger amount of the sample to be purified than would be possible in a vertical tube. Removal of all or part of the sample from the sample tray is much easier than removal of the sample from a glass tube. Also, the spacing between zones is smaller (2 cm vs 10 cm) because the heat transfer is more efficient. The high speed zone refiner therefore both improves purification efficiency and eliminates concerns over bursting of glass tubing.

Figure 5:
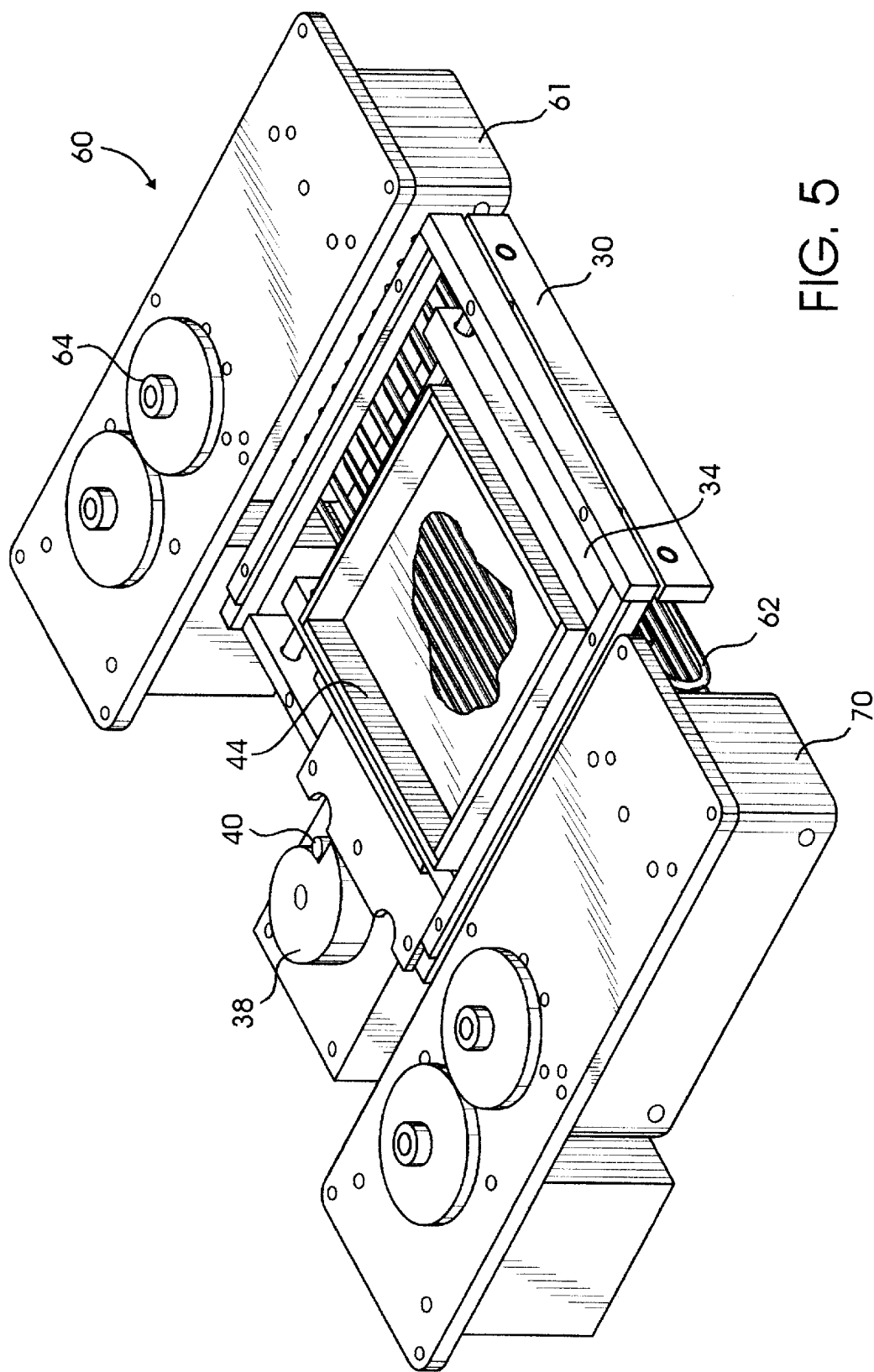
FIG. 5 is a perspective view of a zone refiner embodying principles of the invention in an alternative form.
Figure 6:
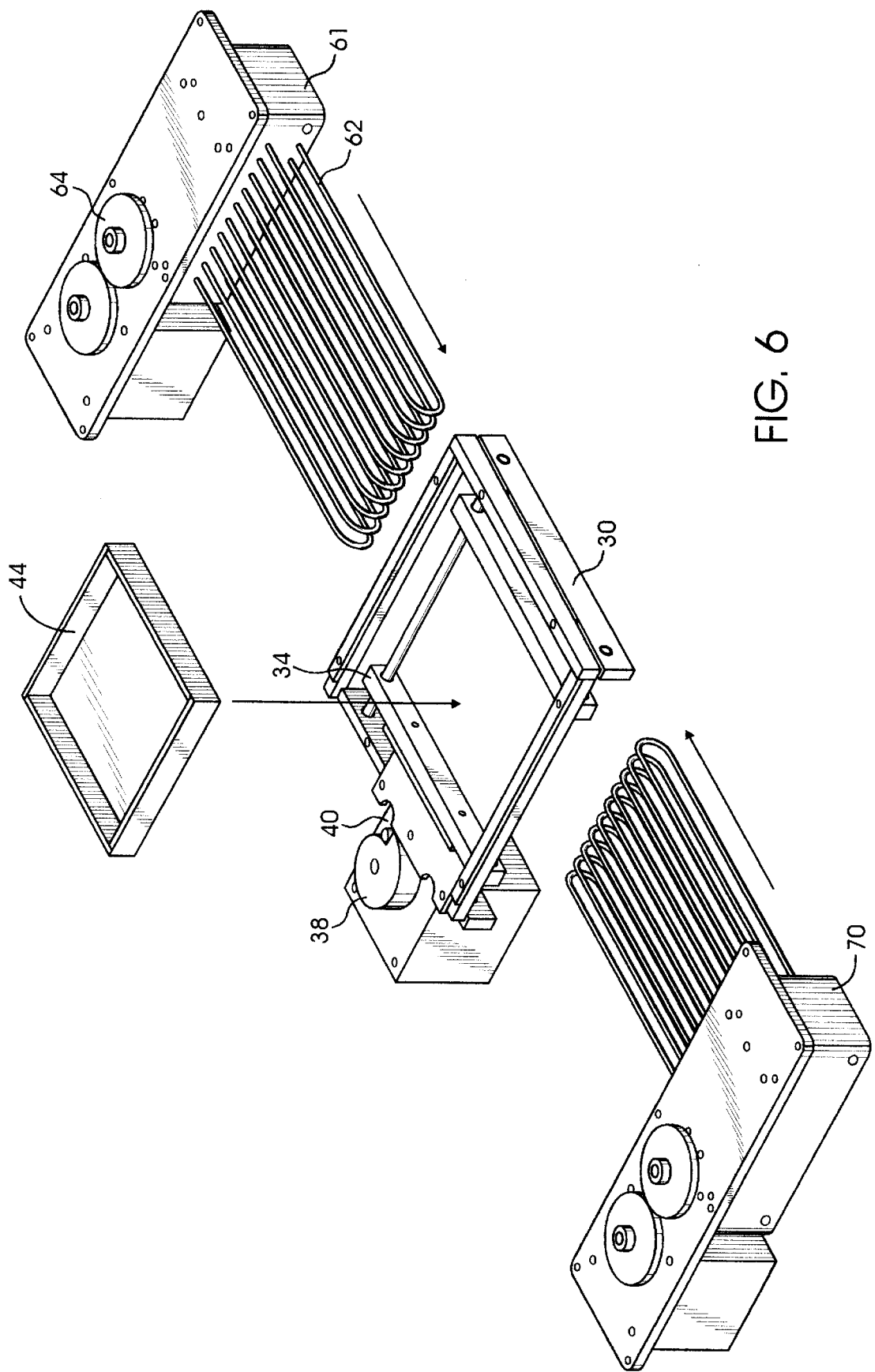
FIG. 6 is an exploded view of the zone refiner of FIG. 5.

With reference next to FIGS. 5 and 6, another embodiment of the invention is shown. The high speed zone refiner 60 has linear hot and cold zones generated by hot and cold liquid flowing through tubing mounted beneath and in thermal contact with the bottom of the sample tray. The heater has a cartridge-type heater 61 which contains a brass reservoir, not shown, for liquid silicone. Ten heater tubes 62 are located directly beneath the sample tray 44. The cartridge heater includes a platinum RTD temperature sensor, not shown, and a gear pump 64. The pumping means for the liquid in this embodiment is the gear pump mounted in the reservoir. The gear pump is driven by a constant speed synchronous motor at about 200 RPM.

The cartridge heater and a platinum RTD temperature sensor are mounted in the bottom of the brass reservoir. The heater and sensor are attached to an electronic control circuit, not shown, that controls the temperature of the block to within 0.1° C. by means of conventional proportional control circuitry, not shown. The liquid used in the reservoir is a liquid silicone designed for high temperature operation. The cooler mechanism 70 is fabricated with an arrangement that is much like a mirror image of the heater mechanism. This facilitates the inclusion of ten cooling tubes between the ten heater tubes in a manner such that the cooling and heating tubes are in contact with the bottom of the sample tray, adjacent to each other. The cooler mechanism 70 is also fitted with a copper cooling coil (not shown) which is silver soldered to the body. This enables the cooling liquid to be pumped through a tube external to the zone refiner. The heating and cooling mechanisms can be operated at temperatures from approximately −20° C. to +300° C. with this external coolant source. The tray traverse mechanism 30 and carriage 34, the stepper motor, and the Archimedes spiral cam 38 and follower 40, are similar to those described in the preferred embodiment.

During operation, the brass heater reservoir is maintained at a constant temperature by the heater and sensor electronic control circuitry. The silicone liquid in the reservoir is pumped through the ten heater tubes and back into the reservoir. The flow generated by the pump is about 500 ml per minute and is sufficient to ensure an even distribution of liquid flow, and therefore a uniform temperature, in each of the ten tubes.

If desired the zone refiner may include leveling devices to insure the level surface of the heating and cooling modules. Also, the heating and cooling modules may include a larger or smaller number of zones, with a greater number of zones allowing for a more rapid and effective refinement process.

The zone refiner can operate in three different modes, depending on the needs of the researcher. One mode is crystallization from the melt (or liquid phase), or classical zone refining. A second is solution recrystallization, while the third is solvent rectification. Crystallization from the melt mode is applicable to any crystalline material that can be melted without decomposition. In this mode a hot zone is passed through a solid bar of sample to be purified. As the sample melts and recrystallizes, the impurities tend to stay in the liquid phase. The crystalline phase is higher in purity than the liquid phase because the crystal structure tends to exclude molecules that do not readily fit in the crystalline lattice. Passing the hot zone many times through the sample results in purification of the sample and, at the same time, concentrates the impurities at an end of the sample.

The solution recrystallization mode is also applicable to any organic crystalline material. This mode is especially valuable for purification of thermally labile substances. In this mode a solvent is used to dissolve the crystals at a temperature just below the boiling point of the solvent. When the sample is placed in the zone refiner, the sample is subjected to moving zones of high and low temperature that alternately dissolve and crystallize the sample automatically. As the hot and cold zones pass through the sample solution the impurities are swept along with the hot zones, ultimately ending up at one end of the sample container.

The solvent rectification mode is identical to the crystallization from melt mode except that the objective is different. In this mode a solvent such as water, benzene, or dimethylsulfoxide (DMSO) is used that can be crystallized near room temperature. The sample is placed in the zone refiner and the crystallization-melting process is used to concentrate components dissolved in the solvent. This mode is especially valuable for concentration of extremely heat sensitive materials such as enzymes and antibiotics.

The improvements described in the high speed zone refiner overcome limitations of conventional refining methods and apparatuses and make the refining more applicable to routine laboratory usage. The new high speed zone refiner is especially useful for scientists involved in preparing or using organic chemical standards for gas chromatography, liquid chromatography, refractometry, absorbance or florescence spectroscopy and any analytical method where it is important to have the highest purity when standardizing or calibrating instrumentation. It may also be used for concentration of heat-labile biological materials in aqueous solutions where the objective is to utilize the power of crystallization to concentrate an enzyme, peptides, antibiotic or any other thermally unstable substance. The high speed zone refiner thus reduces the labor and time required to purify chemicals by crystallization and, at the same time, enables the purification of chemicals to levels of purity not normally attainable.

Accordingly, it is seen that a high speed zone refiner apparatus and method for refining organic chemicals are now provided which allow for a purification of organic chemicals in larger volumes than has yet been available over shorter time frames. Though the apparatus and method have been shown and described in its preferred forms, many modifications, additions and deletions may be made thereto without departure from the spirit and scope of the invention as set forth in the following claims.

I claim:

1. A zone refiner comprising a heat bed having a plurality of elongated heating elements mounted side by side to provide a plurality of side by side spaced elongated heating zones, a sample tray having a flexible bottom for holding an impure organic specimen that is to be refined, and means for cyclically moving said sample tray generally horizontally over said heat bed.

2. The zone refiner of claim 1 wherein said flexible tray bottom is comprised of metallic foil.

3. The zone refiner of claim 1 further comprising a hold down means for holding said sample tray down against said heat bed as said sample is moved over said heat bed by said tray moving means.

4. The zone refiner of claim 3 further comprising a cover adapted to be sealably mounted upon said tray to provide a sealed enclosed refining space, and means for pressurizing said space whereby the flexible bottom of the held down tray is forced into intimate conforming engagement with the heat bed.

* * * * *